United States Patent
Denk

(10) Patent No.: US 7,024,648 B1
(45) Date of Patent: Apr. 4, 2006

(54) COMPUTER-ASSISTED METHOD FOR THE PARALLEL CALCULATION OF THE OPERATING POINT OF ELECTRIC CIRCUITS

(75) Inventor: Georg Denk, Rosenheim (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/009,979

(22) PCT Filed: May 30, 2000

(86) PCT No.: PCT/DE00/01754

§ 371 (c)(1),
(2), (4) Date: Mar. 27, 2002

(87) PCT Pub. No.: WO00/77658

PCT Pub. Date: Dec. 21, 2000

(30) Foreign Application Priority Data

Jun. 15, 1999 (DE) ................................ 199 27 301

(51) Int. Cl.
*G06F 17/50* (2006.01)
(52) U.S. Cl. ............................................ 716/7; 716/4
(58) Field of Classification Search .................. 716/7, 716/4; 703/14
See application file for complete search history.

(56) References Cited

U.S. PATENT DOCUMENTS

| | | | |
|---|---|---|---|
| 5,181,179 A | | 1/1993 | Fang et al. |
| 5,467,291 A * | 11/1995 | Fan et al. | 703/14 |
| 5,930,153 A * | 7/1999 | Melville et al. | 703/14 |
| 6,490,546 B1 * | 12/2002 | Kimmel et al. | 703/14 |
| 6,530,065 B1 * | 3/2003 | McDonald et al. | 716/4 |
| 6,539,346 B1 * | 3/2003 | Chinosi et al. | 703/15 |

FOREIGN PATENT DOCUMENTS

WO      WO 98/24039      6/1998

OTHER PUBLICATIONS

H. Warmers et al., Switch-Level Timing Models in the MOS Simulator BRASIL, Proceedings of the European Design Automatio Conference, pp. 568-572, Mar. 1990.*
U. Bretthauer et al., BRASIL: The Braunschweig Mixed-Mode-Simulator for Integrated Circuits, Proceedings of the Conference with EURO-VHDL '96 and Exhibition on European Design Automation, pp. 10-14, Sep. 1996.*
G. Droge et al., EASY—A System for Computer-Aided Examination of Analog Circuits, Proceedings of Design, Automation and Test in Europe, pp. 644-648, Feb. 1998.*
N. Frohlich et al., A New Approach for Parallel Simulation of VLSI Circuits on a Transistor Level, IEEE Transactions on Circuits and Systems, pp. 601-613, Jun. 1998.*

(Continued)

*Primary Examiner*—A. M. Thompson
(74) *Attorney, Agent, or Firm*—Staas & Halsey LLP

(57) ABSTRACT

A computer-aided method for parallel calculation of the operating point of electrical circuits has the circuit partitioned into a number of partitions in a first step, in which the charging method is used for the parallel calculation of the individual partitions.

14 Claims, 1 Drawing Sheet

OTHER PUBLICATIONS

L. Trajkovic et al., HomSpice: Simulator with Homotopy Algorithms for Finding DC and Steady-State Solutions of NonLinear Circuits, Proceedings of the 1998 IEEE International Symposium on Circuits and Systems, pp. 227-231, Jun. 1998.*

N. Talwalkar et al., A Power BJT Model for Circuit Simulation, 24th Annual IEEE Power Electronics Specialists Conference, pp. 50-55, Jun. 1996.*

C. Ma et al., A Physically-based Lumped-Charge SCR Model, 24th Annual IEEE Power Electronics Specialists Conference, pp. 53-59, Jun. 1993.*

C. Ma et al., A Systematic Approach to Modeling of Power Semiconductor Devices Based on Charges Control Principles, 25$^{th}$ Annual IEEE Power Electronics Specialists Conference, pp. 31-37, Jun. 1994.*

U Wever et al., Parallel Transient Analysis for Circuit Simulation, Proceedings of the Twenty-Ninth Hawaii International Conference on System Sciences, pp. 442-447, Jan. 1996.*

H. Warmers et al., Switch-Level Timing Models in the MOS Simulator BRASIL, Proceedings of the European Design Automation Conference, pp. 568-572, Mar. 1990.*

F. Iannuzzo et al., Physical CAD Model for High-Voltage IGBTs Based on Lumped-Charge Approach, IEEE Transactions on Power Electronics, pp. 885-893, Jul. 2004.*

Fröhlich et al., "A New Approach for Parallel Simulation of VLSI Circuits on a Transistor Level" (IEEE Transaction on Circuits and Systems—I: Fundamental Theory and Applications, vol. 45, No. 6, Jun. 1998, pp. 601-613.

Wever et al., "Parallel Transient Analysis for Circuits Simulation", Proceedings of the 29th Annual Hawaii International Conference on System Sciences, pp. 442-447, 1996.

Spiro, "Simulation Integrierter Schaltungen", 2 Auflage, R. Oldenbourg Verlag Munich, Wien 1990.

Wever, et al., "Domain Decomposition Methods for Circuit Simulation", Proceedings of the 8th Workshop on Parallel and Distributed Simulation, PADS '94 Edinburgh, Scotland, UK, pp. 183-186, Jul. 1994.

Yilmaz E et al.: "Applying Globally Convergent Techniques to Conventional DC Operating Point Analyses", Proceedings 32nd Annual Simulation Symposium, San Diego, CA, USA, Apr. 11-15, 1999, pp. 153-158, XP002173258, 1999, Los Alamitos, CA, USA, IEEE Comput. Soc, USA ISBN: 0-7695-0128-1, Paragraphs ' 02.2!, "03.2!, Figures 1 and 6.

Spiro, "Simulation Integrierter Schaltungen", 2 Auflage, R. Oldenbourg Verlag Munich, Wien 1990, Section 3.7.3.

* cited by examiner

COMPUTER-ASSISTED METHOD FOR THE PARALLEL CALCULATION OF THE OPERATING POINT OF ELECTRIC CIRCUITS

CROSS REFERENCE TO RELATED APPLICATIONS

This application is based on and hereby claims priority to German Application No. 199 27 301.4 filed on Jun. 15, 1999 in Germany, and PCT Application No. PCT/DE00/017754 filed on May 30, 2000, the contents of which are hereby incorporated by reference.

BACKGROUND OF THE INVENTION

The computer-aided simulation of electrical circuits has attained increasing importance in the development of very large circuits, that is to say circuits having a very large number of elements. It is particularly in the development of computer chips having a multiplicity, for example several hundred thousand transistors, that serial processing for the determination of the circuit quantities by a computer has been found to be unusable because of the excessive time consumption.

In WO 98/24039, therefore, it is proposed to partition a large circuit and to have the partitions processed by different computers in each case.

In the calculation, the operating point, that is to say the potentials of all nodes is usually determined first as basis for further analyses such as, for example, transient or alternating-current analyses.

For the parallel calculation, an implementation of the Newton method is proposed in U. Wever, Q. Zheng et al.: "Domain Decomposition Methods for Circuit Simulation" (Proceedings of the 8th Workshop on Parallel and Distributed Simulation, PADS '94 Edinburgh, Scotland, UK, pp. 183–186, July 1994) and in U. Wever, Q. Zheng: "Parallel Transient Analysis for Circuit Simulation" (Proceedings of the 29th Annual Hawaii International Conference on System Sciences, pp. 442–447, 1996). The disadvantage is that convergence can only be achieved here when sufficiently good estimates of the operating point are available, due to poor convergence characteristics. As a rule, however, such good estimates can be achieved with difficulty or not at all in the case of large circuits.

SUMMARY OF THE INVENTION

One aspect of the present invention is, therefore, based on the object of creating a computer-aided method for parallel calculation of the operating point of electrical circuits which ensures simple, reliable and fast calculation of the operating point of the circuit.

In the method, the charging method, which has very good convergence characteristics, is used for the parallel calculation of the operating point.

As described, for example, in H. Spiro: "Simulation of integrated circuits" (2nd edition, R. Oldenbourg Verlag Munich, Vienna 1990), the charging method uses the dynamic elements such as capacitances and/or inductances existing in an electrical circuit for calculating the operating point via a pseudo-transient analysis. In this process, the dynamic elements are charged up step-by-step to a value which, in principle, can have any magnitude, particularly to the value "1", starting from a value zero.

In an embodiment according to the invention, dynamic elements such as, for example, capacitances or inductances having predetermined known values can be additionally installed at suitable places, for example at or between a number of nodes. This makes it possible to avoid problems in the calculation due to the number of dynamic elements being too small.

For this purpose, the dynamic elements additionally inserted into the circuit can be reduced step-by-step to zero from an initial value, for example tending to infinity, for which the operating point calculation is trivial, so that the original circuit is again simulated.

In a preferred embodiment of the invention, at least one node, that is to say a junction of at least two current paths, of the circuit is connected by a capacitance to a predetermined value having a predetermined potential.

In a further development of the invention, however, a capacitance, the second terminal of which is in each case connected to a predetermined potential, for example to ground, can also be connected to each node via all partitions. This procedure has the advantage that the calculation of the operating point, i.e. of the respective potentials of the individual nodes, is trivial for the circuit for an initial value for the capacitances which tend toward infinity, due to the equation, which is then explicit, being solved. Changing the value for the capacitances step-by-step then makes it possible to change the circuit simulation by suitable new selection of the value for the capacitances until a calculation of the operating point of the circuit is obtained for a value of the capacitances tending toward zero or almost toward zero.

By also implementing this charging method for parallel calculation of an electrical circuit, a very large circuit having a multiplicity of transistors can be advantageously calculated in a fast and simple manner even with a smaller number of dynamic elements. Various procedures are conceivable for the respective new determination of the value for the capacitance with the aim of allowing this to go toward zero, the decision criterion being the degree of difficulty of calculating the operating point of the respective preceding step.

The operating point obtained by solving a nonlinear equation for a particular value of the capacitances in each case can be solved, for example, iteratively by the Newton method. For choosing the next value for "C", the number of iteration steps necessary for the solution can then be used until the value drops below a predetermined value for "C".

BRIEF DESCRIPTION OF THE DRAWINGS

These and other objects and advantages of the present invention will become more apparent and more readily appreciated from the following description of the preferred embodiments, taken in conjunction with the accompanying drawings of which:

In the text which follows, the invention will be explained by means of an exemplary embodiment shown in the drawing. In the drawing, the single FIGURE shows a flowchart which represents the individual method steps of the method.

DETAILED DESCRIPTION OF THE PREFERRED EMBODIMENT

Figure 1:
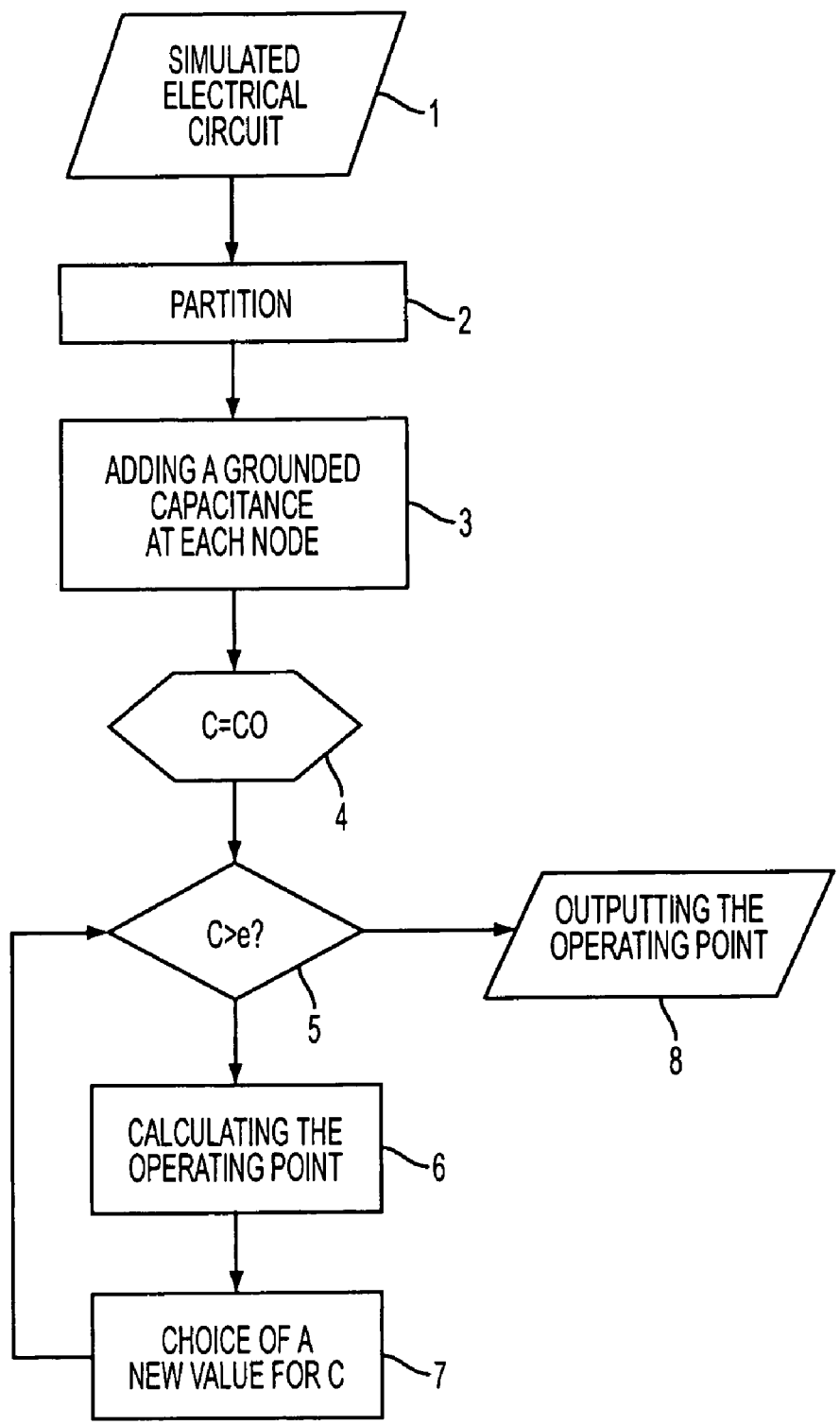

Reference will now be made in detail to the preferred embodiments of the present invention, examples of which are illustrated in the accompanying drawings, wherein like reference numerals refer to like elements throughout.

According to the drawing, a simulation of an electrical circuit is the starting point 1, for example in the circuit description language SPICE. This is partitioned in a first processing process 2, as described, for example, in WO 98/24039 as "Clustering method", so that individual partitions or parts of the circuits are obtained which can be calculated with the same degree of difficulty, if possible.

Naturally, other applicable variants of partitioning are conceivable such as, for example, the "ratio cut method" described in N. Fröhlich, B. Riess, U. Wever, Q. Zheng: "A new approach for parallel simulation of VLSI circuits on a transistor level" (IEEE Transaction on Circuits and Systems—I: Fundamental Theory and Applications, Vol. 45, No. 6, June 1998, pages 601 to 613), or even an arbitrary "manual" division.

In a further process step 3, a grounded capacitance is added to each node of the circuit, that is to say to a junction of at least two conductors or current paths, respectively. Naturally, it is also conceivable to add a capacitance, the second terminal of which is connected to a predetermined potential, in which case both potentials and values for the capacitances of each node can differ. For reasons of efficiency, stability and economy of calculation, each capacitance is connected to the same potential with its second terminal, for example ground, an identically high value C0 also being selected for all capacitances in step 4 for the same reasons.

For this value C0, the operating point is then calculated for each partition or part-circuit in a further step 6, in which the required coupling values, that is to say the values for the coupling points or interfaces of adjacent partitions being exchanged and included in the calculation of the operating points of adjacent partitions.

In this process, a partition which will be called "master" in the text which follows can advantageously take over the control of the charging process for reasons of efficiency. The master then determines the initial value C0 for the capacitances, and it is also conceivable to predetermine the initial value externally, for example by the user. This value C0 is then transferred to all other partitions, called slaves in the text which follows. Following this, the operating point is calculated both in the master partition and in all slave partitions, during which process, naturally, the full source vector, which represents the energy sources existing in the circuit, is present at the circuit.

Starting from an overall problem to be solved $$x = (m, s_1, \ldots, s_p)$$

where
m is the unknowns of the master,
p is the number of partitions,
$s_i$ is the unknowns of partition i,
the charging process leads to the system of differential equations, $$f(x, t) + D\frac{dx}{dt} = 0$$

where
D=diag (C, ... C, 0, ..., 0) and
t is the time.

This system of differential equations can be solved, for example, by the implicit Euler method which leads to the non-linear equation $$f(x^{k+1}, t^{k+1}) + \frac{1}{h}D(x^{k+1} - x^k) = 0$$

where $x^k$ is the solution at time $t^k$ for k=0, 1, etc and h is the step $t^{k+1} - t^k$. This non-linear equation can be solved, for example, iteratively by the Newton method $$x_{n+1}^{k+1} = x_n^{k+1} - \left(f_x(x_n^{k+1}, t^{k+1}) + \frac{1}{h}D\right)^{-1} \cdot \left(f(x_n^{k+1}, t^{k+1}) + \frac{1}{h}D(x_n^{k+1} - x^k)\right)$$

for n=0, 1, etc.

In the parallel calculation, the master then only calculates the unknowns "m", the unknowns "$s_i$" representing fixed areas for the master. To be able to calculate a solution of this, the slaves or slave partitions calculate the corrected values $s_i^{k+1}$ in each iteration step of the master and report these to the master. For this purpose, the slaves must solve the system of non-linear equations.

$$f_i(s_i^{k+1}, m_n^{k+1}, t^{k+1}) + \frac{1}{h}D_i((s_i^{k+1}, m_i^{k+1}) - (s_i^k, m^k)) = 0$$

where $f_i$ and $D_i$ are the corresponding equations and matrices for the slave "i". This non-linear equation can also be calculated by the Newton method and not all iteration steps have to be necessarily performed to convergence.

The results of the slaves are then inserted into the system equations of the master whereupon the master can calculate the expression $m_{n+1}^{k+1}$.

In a next step 7, a new value "$C_{new}$" for "C" is determined by the master and the slaves can also make suggestions. To achieve the aim, namely a value for "C" tending to zero or, respectively, less than a predetermined value e, and thus a calculation of the original circuit, the choice of the new value "$C_{new}$" for "C" is made dependent on the difficulty of calculating the preceding step with the value "$C_{old}$" for "C".

In this context, various procedures are conceivable, for example the choice of "$C_{new}$" in dependence on an analysis of the number of iteration steps which the master needed for calculating the non-linear system of equations for the preceding value "$C_{old}$" for "C":

$$C_{new} = \begin{cases} C\frac{old}{2} & \text{is } n < n_1 \\ C_{old} & \text{is } n_1 \le n \le n_2 \\ C_{old} \cdot 2 & \text{is } n_2 > n \end{cases}$$

where "n" is the number of iterations of the master and "$n_1$" "$n_2$" are the parameters predetermined by the user. Naturally, instead of halving or doubling "$C_{old}$", respectively, other strategies for reducing or enlarging "$C_{old}$" are also possible. Additionally, the number of iteration steps needed by the slaves or slave partitions for solving their non-linear system of equations can also be taken into consideration, for example through the choice of $$n = \max\left(n, \sum_{i=1}^{n} n_i, slave1, \ldots, \sum_{i=1}^{n} n_i, slavep\right)$$

where $n_i$, $s_{lavej}$ is the number of iteration steps of slave j, during the i-th iteration of the master. It must be noted in this context that the choice of a value for "C" only affects the efficiency of the method not the operating point itself.

After a value for "C" of less than or equal to a predetermined value e has been reached, the calculation is terminated at branch 5 and the value for C can be set to "0" in a last step. The operating point of the original circuit is thus found as result 8 and can be output via output units such as for example, a screen, printer or the like and/or stored in a memory as basis for further analyses of the circuit.

Due to the method described above, an operating point of a very large electrical circuit can be advantageously calculated in parallel by a multiplicity of computers or processors and the disadvantage of known parallel types of calculation, namely lack of convergence with unfavorable starting values can be avoided. Due to the parallel calculation, the expenditure for calculation with regard to iteration steps and setting a value for "C" step by step, can be kept within tolerable limits due to the distribution to a number of processors.

The operating point thus calculated is then used as basis for further analyses, for example the alternating-current analysis of a circuit.

The invention has been described in detail with particular reference to preferred embodiments thereof and examples, but it will be understood that variations and modifications can be effected within the spirit and scope of the invention.

What is claimed is:

1. A computer-aided method for parallel calculation of the operating point of an electrical circuit having nodes, comprising:

partitioning the circuit into a plurality of partitions;
    using a charging method for the parallel calculation of the operating point for individual partitions, the charging method being based on a charging of dynamic elements existing in the circuit; and
    for simulation purposes, adding additional dynamic elements to the circuit, the additional elements being chargeable and being used in the charging method, together with the dynamic elements existing in the circuit.

2. The computer-aided method as claimed in claim 1, wherein for simulation purposes each node of the circuit is connected to a predetermined potential via a capacitance to produce a modified circuit so that an operating point of the modified circuit is calculated.

3. The computer-aided method as claimed in claim 2, wherein an equal capacitance is provided at each node of a partition.

4. The computer-aided method as claimed in claim 3, wherein each node of a partition is connected to a same potential via a capacitance.

5. The computer-aided method as claimed in claim 4, wherein a capacitance having a same value is provided at each node of all partitions.

6. The computer-aided method as claimed in claim 5, wherein each node of all partitions is connected to the same potential by means of a capacitance.

7. The computer-aided method as claimed in claim 6, wherein the potential is connected to ground.

8. The computer-aided method as claimed in claim 7, wherein the operating point of the circuit is calculated with a suitable step-by-step change in the value of the capacitance; and the operating point is recalculated until the values of the capacitances are almost zero.

9. The computer-aided method as claimed in claim 2, wherein each node of a partition is connected to a same potential via a capacitance.

10. The computer-aided method as claimed in claim 9, wherein a capacitance having a same value is provided at each node of all partitions.

11. The computer-aided method as claimed in claim 2, wherein each node of all partitions is connected to a same potential via a capacitance.

12. The computer-aided method as claimed in claim 2, wherein the potential is connected to ground.

13. The computer-aided method as claimed in claim 2, wherein the operating point of the circuit is calculated with a suitable step-by-step change in the value of the capacitance; and the operating point is recalculated until the values of the capacitances are almost zero.

14. A computer readable medium storing a program which when executed by a computer performs a method for parallel calculation of the operating point of an electrical circuit having nodes, the method comprising:

partitioning the circuit into a plurality of partitions;
    using a charging method for the parallel calculation of the operating point for individual partitions, the charging method being based on a charging of dynamic elements existing in the circuit; and
    for simulation purposes, adding a additional elements to the circuit, the additional elements being chargeable and being used in the charging method, together with any dynamic elements existing in the circuit.

* * * * *